United States Patent [19]

Phinney et al.

[11] Patent Number: 4,876,114
[45] Date of Patent: Oct. 24, 1989

[54] PROCESS FOR THE SELF FRACTIONATION DEPOSITION OF A METALLIC LAYER ON A WORKPIECE

[75] Inventors: Richard R. Phinney, South Hero; David C. Strippe, Waterbury Center, both of Vt.

[73] Assignee: International Business Machines Corporation, Armonk, N.Y.

[21] Appl. No.: 237,193

[22] Filed: Aug. 29, 1988

Related U.S. Application Data

[62] Division of Ser. No. 100,068, Sep. 23, 1987, Pat. No. 4,791,261.

[51] Int. Cl.$^4$ .......................... B05D 3/02; C23C 16/06
[52] U.S. Cl. ..................................... 427/45.1; 427/46; 427/124; 427/125; 427/250
[58] Field of Search ................ 427/45.1, 46, 124, 125, 427/250, 255

[56] References Cited

U.S. PATENT DOCUMENTS

| | | | |
|---|---|---|---|
| 3,401,055 | 9/1968 | Langdon et al. | 427/250 |
| 3,505,131 | 4/1970 | Wells | 427/250 |
| 3,576,670 | 4/1971 | Hammond | 427/250 |
| 3,775,157 | 11/1973 | Fromson | 427/250 |
| 3,934,059 | 1/1976 | Polinsky | 427/250 |
| 3,985,281 | 10/1976 | Diepers et al. | 427/250 |
| 4,061,800 | 12/1977 | Anderson | 427/46 |
| 4,426,569 | 1/1984 | Miller et al. | 219/272 |
| 4,472,453 | 9/1984 | Hoffmann | 427/35 |
| 4,791,261 | 12/1988 | Phinney et al. | 118/726 |

Primary Examiner—Sadie Childs
Attorney, Agent, or Firm—Francis J. Thornton

[57] ABSTRACT

A process for the evaporation deposition of a layer of metal on a workpiece is described in which a charge of a metal is placed in a crucible formed of a material having a vapor pressure lower than the vapor pressure of the metal at a selected temperature, a shield is placed between the workpiece and the crucible, and the crucible is then heated to a first temperature sufficient to melt said charge, but insufficient to cause substantial evaporation of said charge following which the crucible is heated to a second temperature level for a time sufficient to fractionally distill the charge and sublime or vaporize any non-metallic contaminants in said charge and finally the crucible is heated to a third temperature sufficient to evaporate the charge at a selected rate at which time the shield is removed from between the crucible and the workpiece to permit evaporant from the charge to coat the workpiece.

6 Claims, 3 Drawing Sheets

PROCESS FOR THE SELF FRACTIONATION DEPOSITION OF A METALLIC LAYER ON A WORKPIECE

This is a divisional application of application No. 100,068, filed Sept. 23, 1987, now U.S. Pat. No. 4,791,261.

BACKGROUND OF THE INVENTION

This invention relates generally to material deposition apparatus, and more particularly to an evaporation source used in a RF evaporation apparatus and to a process for the self fractionation deposition of a metallic layer on a workpiece.

Evaporation apparatus is well known in the art. U.S. Pat. No. 3,401,055 to J. L. Langdon et al, issued Sept. 10, 1968, and assigned to the IBM Corporation, describes how such evaporation apparatus is used in semiconductor integrated circuit processing technology. Specifically, this patent teaches a method of depositing a metal such as a solder onto a plurality of small areas simultaneously on a semiconductor device.

As semiconductor integrated circuit chips have become denser, i.e., a million or more semiconductor devices per chip, evaporated films must meet more exacting criteria. Specifically, the films must have a thickness that does not appreciably vary either across one wafer or wafer to wafer, and the amount of conductivity-detracting impurities such as oxides must be kept at a minimum.

Using the evaporation apparatus and techniques of the prior art, for example as in the above identified U.S. Pat. No. 3,401,055, fabrication of a uniform formation of high quality thin films of low vapor pressure materials (e.g. copper) is extremely difficult. Thus, there is a need in the art for an evaporation apparatus that can efficiently deposit low vapor pressure metallic films.

SUMMARY OF THE INVENTION

Accordingly, it is a general object of this invention to eliminate the disadvantages associated with prior art evaporation apparatus so as to provide uniform high quality evaporated thin films as required by dense semiconductor integrated circuit chips.

A more particular object of the invention is to provide an evaporation source for use in an RF evaporation apparatus which results in the deposition of high quality, uniform thin films.

The invention is directed toward a unique evaporation source for evaporating high quality, uniform metallic films onto a semiconductor workpiece (e.g. a wafer). The evaporation source of the present invention comprises an RF coupling susceptor having a volume commensurate with or greater than the amount of charge disposed within an overlaying crucible. More particularly, the source of the invention includes a pair of coaxial, cupped heat shields surrounding a flared lip crucible that is supported away from the base of the innermost heat shield by a thermal isolator and a nonmetallic susceptor. The flared lip of the crucible overlaps and covers the exposed edges of the heat shields. By utilizing the source of the invention, the charge being evaporated from within the crucible can be rapidly heated to promote self-fractionation, thus eliminating conductivity-detracting impurities from the deposited film while providing a film of uniform thickness.

The foregoing and other objects, features and advantages of this invention will be apparent from the following more particular description of a preferred embodiment of the invention as illustrated in the accompanying drawings, wherein:

DETAILED DESCRIPTION OF THE INVENTION

Figure 1:
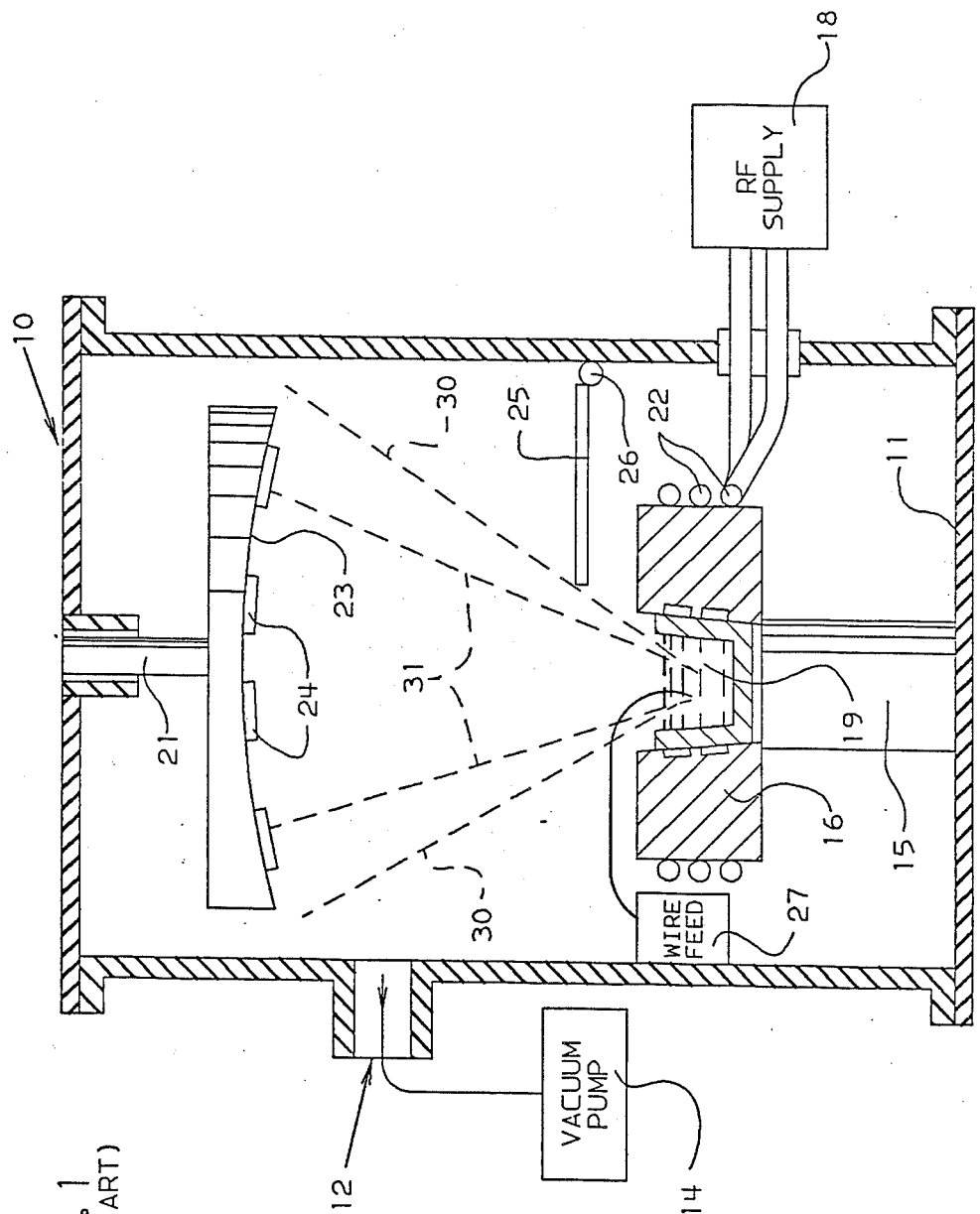
FIG. 1 (Prior Art) shows a cross-sectional schematic of a conventional evaporation apparatus.

FIG. 1 (Prior Art) shows, in some detail, the general structures associated with conventional evaporation apparatus. A vacuum chamber 10 has a base 11 and a porthole 12 which is connected to a source of vacuum 14. Seated on a pedestal 15 affixed to base 11 is a crucible 16 containing a charge 19 of material to be evaporated. Wrapped around crucible 16 and connected to a suitable RF source 18 (such as 3 kilowatt power supply) are a plurality of RF heating coils 22. One suitable power supply is a EN1 PS 300 as sold by the EN1 Corporation of Rochester, New York. A holder 23, which can be rotated, if desired, is supported by a rod 21 descending from the top of the chamber 10, and a plurality of workpieces 24 are disposed on the holder 23. Each workpiece 24 is, for example, a semiconductor wafer, such as silicon, having a plurality of previously created chip sites that are to be coated with metallic layers. Each wafer may bear a protective coating, such as photoresist or the like, that clearly delineates the metallic pattern to be deposited on the semiconductor surface. Alternatively, the metallic material may be deposited on the wafers in the absence of such protective coating, in which case the pattern will be defined by subsequent subtractive etching.

An interposing shutter 25 comprising a solid plate of stainless steel can be selectively positioned between the substrates 24 and the crucible 16 by motor 26. The shutter 25 can be moved to the left to block the partially or totally emission of evaporant from the crucible 16. During the evaporation phase the path of the evaporant is generally cone shaped as if the evaporant came form a point source, as indicated by dashed lines 30.

If desired, the evaporation source can be disposed in an entirely separate chamber below the evaporation chamber 10. In this manner the sources may be heated independently of the workpieces. An example of this system is the Balzers SCS 800 isolated source load lock evaporation system. Such portioned apparatus is well known to the prior art. It is preferred to provide the evaporation source of the invention to this type of evaporation system.

A mechanism 27 is provided within the evaporation chamber 10 for automatically feeding a wire, of the material in the crucible being evaporated, into the crucible to automatically replenish the charge 19 as it becomes diminished by evaporation.

It should be noted that such an evaporation apparatus is presently well known and commercially available and is described above in only the most rudimentary form.

In the prior art, when depositing a low vapor pressure metal such as copper, it was found that during the initial heating and melting phase any impurities contained within the charge would, during the evaporation thereof, emit particles of impurity material (e.g. oxide) from the molten evaporant source. This phenomenon (known as "spitting") results in large particles of the evaporant and oxide in a solid, liquid or semisolid state being transmitted to the workpiece. These impurity particles of materials cause irregularities, such as large spheres, lumps, or voids, to appear in the evaporated film. These irregularities reduce the conductivity of the film, causing electrical defects and the like that result in a lower production yield of finished work.

In addition, prior art evaporant crucibles were generally designed to be relatively deep with respect to their diameter, i.e., their depth was generally at least twice their diameter. This causes, as the charge becomes diminished, a narrowing of the stream of evaporant material, as shown by dashed lines 31. Because of this narrowing of evaporant the center workpieces 24 accumulate a significantly larger amount of material than does any of the workpieces on the perimeter of the holder 23, also leading to a lack of uniformity of deposit.

The present inventors succeeded in overcoming these disadvantages of the prior art by redesigning the evaporation source. Specifically, the inventors found that when the charge is quickly heated to a temperature at which it self-fractionates (i.e., pure metal is separated from the oxide impurities), and thereafter is deposited onto the workpieces, the oxide impurities are eliminated from the film as-deposited. An evaporation source that is compatible with such a self-fractionation heating process will be described in detail below in conjunction with FIG. 2.

Figure 2:
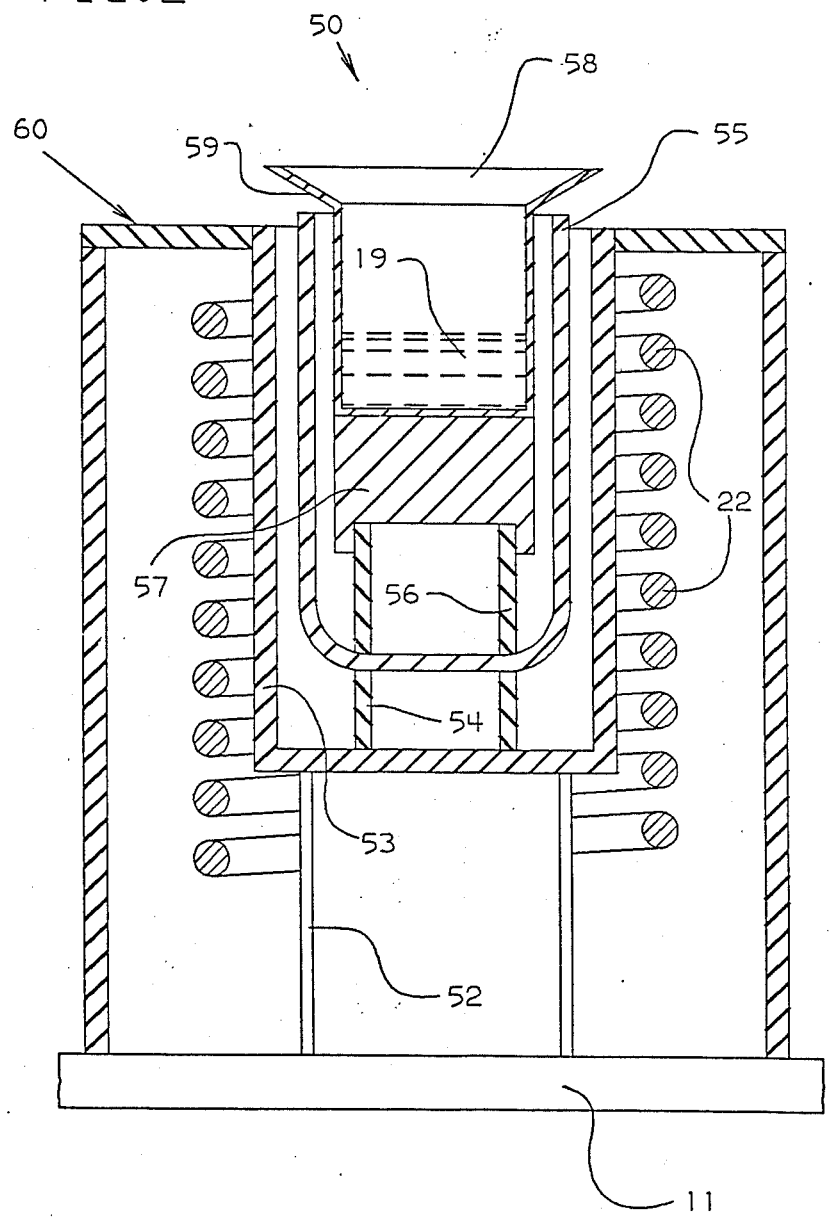
FIG. 2 shows in detailed cross-section the crucible of the present invention.

The evaporation source 50, shown in FIG. 2, is designed to be substituted for the post 15 and crucible 16 in FIG. 1, and basically comprises a thermally isolating column or spacer 52 on base 11, which in turn supports an outer heat shield 53. Contained within the outer heat shield 53 is a second thermally isolating spacer 54 which supports and thermally isolates an inner heat shield 55 from the outer heat shield 53. Within the inner heat shield 55 there is disposed a third thermally isolating spacer 56 upon which there is disposed a susceptor 57 which in turn supports a crucible 58. This crucible is provided with a flared lip 59 which extends from the inner edge of the crucible above the lips or upper edges of the two heat shields 53 and 55. A multiplicity of RF coils 22 matched to the power supply, as is well known in the RF heating industry, surround the above described structure.

As shown in FIG. 2, there is also provided an outer casing 60 coupled to the outer heat shield 53 to surround and enclose the coils 22. The casing 60 prevents any of the evaporated material from depositing on the coils 22, the outer heat shield 53, or the thermal isolating column 52. This casing need not be used and can be eliminated, but because it aids in extending the life of the coils 22 and eliminates the need of cleaning the column and outer heat shield after every evaporation run, it is very desirable.

In operation, when the RF power supply 18 is activated, the coils 22 emit RF energy which is concentrated within the confines of the coil. This energy is absorbed by the material adjacent the coil, and the material begins to heat due to eddy currents developed therein by the emitted frequencies.

Because it is necessary to heat the charge 19 to controlled temperatures at which it will self-fractionate and evaporate in a relatively short time, and since it is desirable that this be accomplished with the lowest possible energy expenditure, it is necessary to select both the configurations and compositions of the susceptor 57 and crucible 58 so as to absorb the maximum amount of energy and convert it into heat, and to transfer the heat by radiation and conduction to the material 19 within the crucible 58. The other components of the source 50 are selected to minimize this RF absorption so that the level to which they become heated is minimized.

The susceptor 57 is made of a solid, columnar block of graphite carbon 1⅛ inches in diameter and ½ inches high. The crucible 58 is 1 3/16 inches in diameter and 11/16 inches deep, and is made of a material (e.g. molybdenum) that has a lower vapor pressure than the material to be evaporated (e.g. copper). The crucible is filled with approximately 30 grams of material, such that it is partially filled (i.e., the material within the crucible forms a pool approximately 5/16 inches high). The inventors found that when the initial volume of charge to be deposited is commensurate with (e.g. ⅜) the volume of the suceptor 57, the charge can be completely self-fractionated. The self-fractionation efficiency increases as the amount of charge decreases (i.e. as the charge/susceptor volume ratio decreases). On the other hand, if the charge/susceptor volume ratio is increased by increasing the charge size or charge volume, or decreasing the susceptor, or a combination of both, the self-fractionation process will not be as efficient. At very high charge/susceptor ratios, self-fractionation does not occur to an extent sufficient to improve the properties of the film as-deposited.

The susceptor 57, being a relatively large mass and being very receptive to heating by RF frequencies, assures that the charge 19 contained within the crucible 58 is heated to the desired levels necessary to melt and evaporate the charge 19 in the crucible 58. Such susceptors are especially required when the charge is a low vapor pressure material (e.g. copper or gold) that is not very absorbant of RF energies.

The base 11, upon which the unit under discussion is mounted, is usually metallic and relatively large. It is therefore very radiative (i.e., it acts as a heat sink). Since it is necessary to heat the contents of the crucible rapidly, a quartz thermal insulator 52, in the form of a hollow column having an outside diameter of 1½ inches, a height of 1⅜ inches, and an inner diameter of 1¼ inches, is disposed to support the outer heat shield 53 from the base 11. This outer heat shield 53 is a cup formed of high density silica having a wall thickness of ⅛ inch on outer diameter of 1 11/16 inches and a height of 1¾ inches. Similarly, the quartz spacer 54 also in the form of a 1/16 inch ring 1 5/16 inches in diameter and 3/16 inches in height is disposed in the bottom of the cup shaped outer shield 53 to maintain and thermally isolate the inner heat shield 55 from the outer heat shield 53. This inner heat shield is formed of pyrolytic boron nitride and has an outer diameter of 1⅜ inches in diameter, a height of 1 9/16 inches and a wall thickness of 1/16 inches. Quartz and pyrolytic boron nitride are used for most of the thermal isolators and the inner heat shield because such materials are transparent to radio frequencies emitted by the coil 22 and thus becomes heated very slowly. Other material having similar properties could be used. Also, such materials can be made in very pure form such that they do not provide any contaminants in the system.

The outer heat shield 53 is formed of silica which has improved thermal characteristics over those of quartz. The inner shield 55 is formed of pyrolytic boron nitride.

Pyrolytic boron nitride is used as the inner heat shield because it prevents infrared radiation from being emitted from either the susceptor or the crucible. In this way the inner shield acts to retain heat within itself, i.e. in the crucible area and susceptor area, while shielding the outer shield 53 from infrared radiation.

A boron nitride support ring 56, 15/16 inches in diameter which is $\frac{1}{8}$ inch in height and 1/16 inches thick is disposed within the inner heat shield 55 to support a carbon susceptor 57 which in turn supports the crucible 58. Pyrolytic boron nitride is used for this support ring 56 not only because it is a good thermal isolator but also because it is formed with the highest purity and does not interact with the carbon of the susceptor 57 at the high temperatures at which source is operated.

It should be noted that the crucible 58 has an outwardly directed flared lip 59. This lip 59 protects the top exposed edges of the shields 53 and 55 and prevent any of the material being evaporated from within the crucible from depositing on the inner edges of the heat shield 55. Moreover, note that the depth of the crucible is less than its diameter. If the depth/diameter ratio is increased to the point where the depth is greater than twice the diameter, the above-described uniformity problems result.

Figure 3:
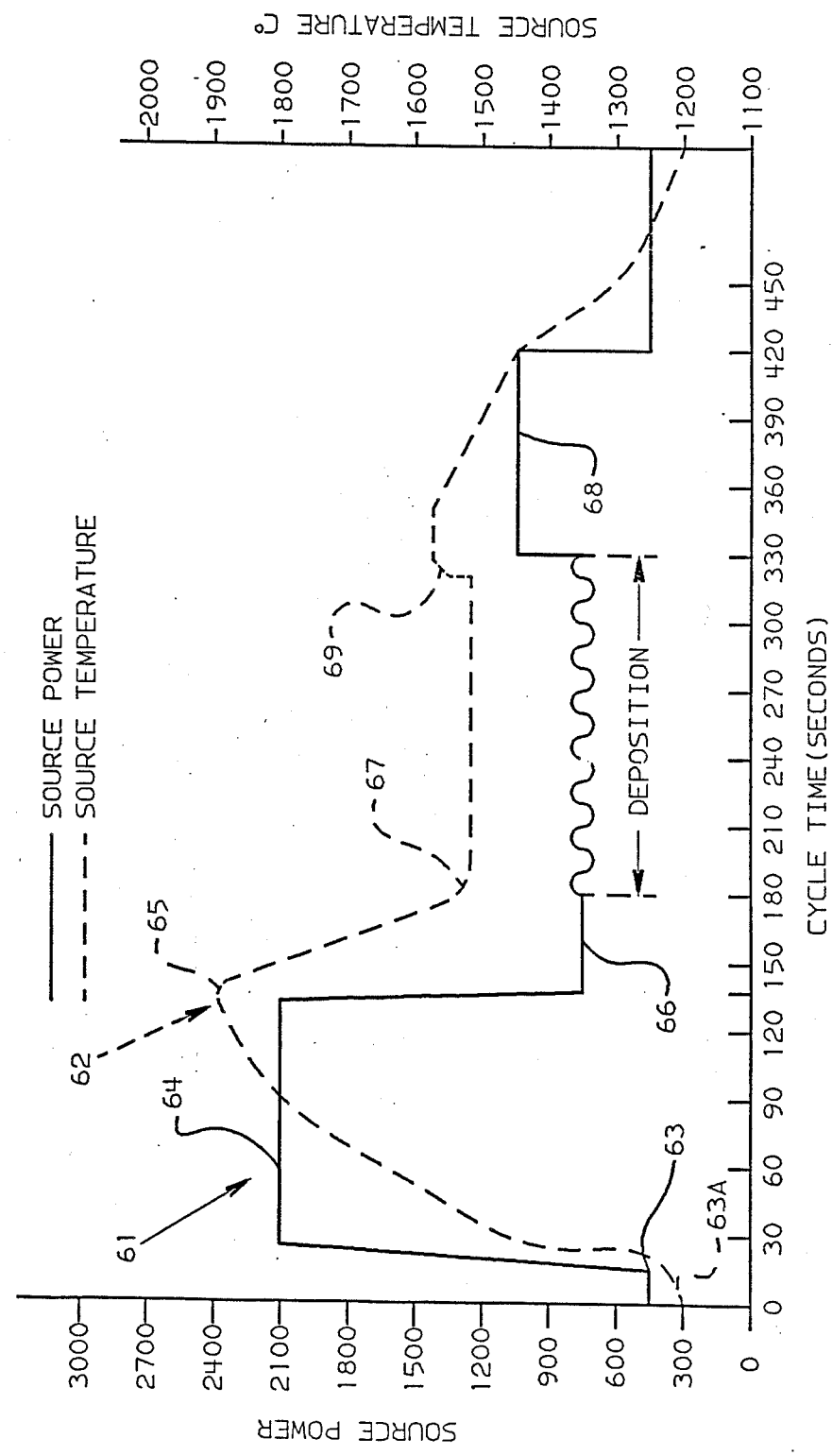
FIG. 3 shows a plot of the time/temperature cycle used in the present invention.

With reference now to FIG. 3, there is shown the RF power curve (solid line 61) and the temperature curve (dotted line 62) associated with the self-fractionation and deposition processes that can be carried out using the evaporation source of the invention. A 3 kilowatt RF power supply was used, and a charge of 30 grams of copper was disposed within the crucible. At the beginning of the cycle, the workpieces are located in the vacuum chamber and the chamber is evacuated. Four hundred fifty watts of RF power, as shown by that portion of the power curve marked 63, is then applied to the coils. The susceptor 57 begins to heat and to transfer this heat by a radiation and conduction process into the charge in the crucible, and the charge begins to melt with little or no evaporation occurring. This power level is maintained until the temperature of the charge stabilizes at 1200° C., as shown by that portion of the temperature curve marked 63A. During this time, to protect the workpieces from any undesired evaporation or contamination, the shutter 26 is moved to the left from the position. When the workpieces are to be coated, the RF power is ramped to between 2 kilowatts and 2.1 kilowatts, and is maintained there for approximately 135 seconds. This is shown by that portion of the power curve marked 64. Subsequently the power level is reduced to 780 watts (portion 66). During this time the temperature of the charge 19 is increased and self-fractionation, i.e. fractional distillation, of the charge 19 occurs. As this fractional distillation begins, any contaminants in the charge (such as oxides or the like) adhere to the surface of the melt to form a slag-like surface layer. As the RF power is increased, the temperature of the charge also increases and the fractional distillation continues until the contaminants collected on the liquid surface of the melted charge become either sublimed or vapored due to limits set by respective vapor pressures of the material used in the charge and its oxides and other contaminants. The impurities migrate to the edge of the crucible where they are drawn up the side of the crucible. In copper, this occurs because a high vapor pressure of copper evaporant is created, which pushes the surface contaminants and the like to the sidewalls of the crucible (which are at a temperature slightly higher than that of the melted charge). Once this fractionation process is completed the temperature of the crucible has peaked at 1900° C. (reference numeral 65 on curve 62). The RF power is then decreased to a power level of 780 watts as indicated by numeral 66 on curve 61. This power level corresponds to the desired rate of deposition of 4 angstroms per second of the charged material on the surface of the workpieces 24 when the workpiece is 28 inches away from the crucible 58. Forty-five seconds after this decrease in RF power, when the temperature of the charge 19 stabilizes at about 1510° C., as indicated by numeral 67 on curve 62, the evaporant shield or shutter 24 is withdrawn from in front of the workpiece to permit the evaporant to coat the workpiece. This power level is maintained for an additional 150 seconds at which time the shutter 24 is then positioned in front of the workpiece to prevent further deposition on the workpieces. Simultaneously with the shutter 24 closing, the power level is raised to 1000 watts as indicated by reference numeral 68, and is maintained at this level for 90 seconds. This causes a slight rise in temperature of the charge 19 as indicated by numeral 69 on curve 62. Twenty-four seconds after the shutter closes and the power level rises, wire is fed from the wire feed 27 into the crucible to replenish the charge therein. As the wire melts and replenishes the charge the temperature of the charge decreases as indicated by numeral 70 on curve 62.

At the end of 90 seconds the power is again decreased to the standby power level of 450 watts and the temperature of the charge continues to decline to 1200° C. at which temperature it again stabilizes.

By supporting all of the units of the invention within the coils 22, as described above, the crucible 58 is heated in a thermally controlled manner to provide self-fractionation. This self-fractionation phenomenon eliminates any spitting of copper or copper oxides and eliminates the need for utilizing ultra pure material as a source. Self-fractionation of the charge is particularly important when the material of the charge has a large amount of impurities that are introduced during its replenishment.

By utilizing the present invention as described above, copper films free of voids or inclusions and with less than 0.001% by weight of non-metallic contaminants contained therein have been successfully deposited on semiconductor wafers.

While the invention has been particularly shown and described with reference to a preferred embodiment thereof, it will be understood by those skilled in the art that the forgoing and other changes in form and details may be made therein without departing from the spirit and scope of the invention.

What is claimed is:

1. A process for the evaporation deposition of a layer of metal on a workpiece comprising the steps of:

depositing a charge of a solid metal, having a selected vapor pressure at a selected temperature, in a crucible formed of a material having a vapor pressure lower than the vapor pressure of the metal at said selected temperature, placing a shield between the workpiece and the crucible, applying sufficient energy to the crucible to increase the temperature of the charge to a first level sufficient to melt said charge contained therein, but insufficient to cause substantial evaporation of said charge, increasing the energy applied to the crucible to increase the temperature of the charge to a second level, maintaining said temperature at said second level for a time sufficient to fractionally distill the charge and sublime or vaporize any non-metallic contaminants in said charge, altering the level of energy applied to the charge to set the temperature of the charge at a third level to evaporate the charge at a selected rate, and removing the shield from between the crucible and the workpiece to permit evaporant from the charge to coat the workpiece.

2. The process of claim 1 wherein said metal is copper.

3. The process of claim 1 wherein said metal is gold.

4. The process of claim 1 wherein said first level is approximately 1200° C., said second level is approximately 1900° C., and
said third level is approximately 1500° C.

5. The process of claim 1 wherein there is provided the further step of replacing said shield between the workpiece and crucible after a selected period of time,
altering the energy to set the temperature of the charge at a fourth level for a selected period of time,
replenishing said charge, and
reducing the energy to reset the temperature of the charge at said first level.

6. A process for the self-fractionation deposition of a metallic layer on a workpiece consisting of the steps of:
depositing a body of copper in a molybdenum crucible which body is less than five-eights of the volume of the crucible,
shielding the workpiece from the crucible with a removable shield,
applying RF power to the crucible to heat the body of copper contained therein to a stable temperature of about 1200° C.,
increasing the RF power applied to the crucible and the body of copper, to increase the temperature of the charge about 1900° C.,
lowering the power level applied to the device to lower the temperature of the body of copper to 1510° C., and
removing the shield from between the crucible and the workpiece to permit evaporant from the body of copper to coat the workpiece.

* * * * *